US006842125B2

(12) United States Patent
Mauro et al.

(10) Patent No.: US 6,842,125 B2
(45) Date of Patent: Jan. 11, 2005

(54) UNIPOLAR ELECTRICAL TO CSRZ OPTICAL CONVERTER

(75) Inventors: John C. Mauro, Painted Post, NY (US); Salvatore Morasca, Como (IT); Valerio Pruneri, Milan (IT); Srikanth Raghavan, Ithaca, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 10/435,981

(22) Filed: May 12, 2003

(65) Prior Publication Data

US 2004/0227649 A1 Nov. 18, 2004

(51) Int. Cl.[7] .............................................. H03M 7/12
(52) U.S. Cl. .................................. 341/69; 385/1; 385/2
(58) Field of Search ............................ 341/69, 68, 70, 341/50, 159, 64; 385/1, 2, 3, 4

(56) References Cited

U.S. PATENT DOCUMENTS

| | | | |
|---|---|---|---|
| 5,625,722 A | * | 4/1997 | Froberg et al. ................. 385/1 |
| 6,542,280 B2 | | 4/2003 | Walkin ...................... 359/276 |
| 2002/0093993 A1 | | 7/2002 | LaGasse et al. ............ 370/536 |
| 2003/0058504 A1 | | 3/2003 | Cho et al. .................... 359/161 |
| 2003/0156774 A1 | * | 8/2003 | Conradi .......................... 385/2 |

OTHER PUBLICATIONS

"Pulse Generation for Soliton Systems Using Lithium Niobate Modulators" Veselka, et al, IEEE Journal of Selected Topics in Quantum Electronics, vol. 2, No. 2, Jun. 1996.
"A Soliton Transmitter Using a CW Laser and an NRZ Driven Mach–Zehnder Modulator" Veselka, et al IEEE Photonics Technology Letters, vol. 8, No. 7, Jul. 1996.
"Intrachannel Nonlinear Penalties in Dispersion–Managed Transmission Systems" Kumar, et al, IEEE Journal of Selected Topics in Quantum Electronics, vol. 8, No. 3, May/Jun. 2002.

* cited by examiner

*Primary Examiner*—Brian Young
*Assistant Examiner*—John B Nguyen
(74) *Attorney, Agent, or Firm*—Juliana Agon

(57) ABSTRACT

A conversion method for converting a unipolar voltage data stream into a carrier-suppressed return-to-zero (CSRZ) optical data stream includes modulating a continuous optical wave with an encoded nonreturn-to-zero (NRZ) voltage data stream for providing a CSRZ optical data stream of full-width at half-maximum (FWHM) pulse width less than one-half of the transition time of the encoded nonreturn-to-zero (NRZ) voltage data stream between logical states for a reduced pulse width. The modulating circuit is either a duobinary modulator driven with a swing of $\pm 2V_\pi$ or an optical time domain multiplexed plurality of nonreturn-to-zero (NRZ) modulators with phase shifting and differential encoding.

20 Claims, 6 Drawing Sheets

UNIPOLAR ELECTRICAL TO CSRZ OPTICAL CONVERTER

BACKGROUND OF THE INVENTION

1. Field of the Invention

The present invention relates generally to optical transmission, and particularly to an optical transmission system with reduced optical signal pulse width of a modulated output signal.

2. Technical Background

Until recently, most fiber optic communications systems employed Nonreturn-to-Zero (NRZ) modulation in which each logical bit, at a logical state, or pulse was transmitted as a pulse whose full pulse width was equal to the full bit period, T=1/B, where B is the bit rate at which pulses are transmitted. More recently, it has been shown that Return-to-Zero or RZ signaling provides better performance in terms of reduced degradation of dense wavelength division multiplexed (DWDM) system performance due to fiber non-linearities such as four wave mixing (FWM) and cross-phase modulation (XPM).

RZ modulation can be implemented in a variety of known different binary signaling formats, which all have significantly different optical transmission spectra. Of these formats, unipolar RZ or single-phase RZ (RZ-SP) is the most straight forward to implement in optical fiber transmission systems, although what has become known as optical carrier-suppressed RZ (CS-RZ) and duobinary have also been implemented as novel modulation techniques that resist fiber nonlinear impairments on carefully engineered dispersion-managed transmission links.

CSRZ optical signals have the feature of presenting bits that are phase-shifted relative to neighboring bits such that on the average all the phases cancel each other out for a net phase of zero. For example, a CSRZ optical data stream may consist of a plurality of CSRZ output pulses where half of the pulses have an alternating phase relationship with the other half of the pulses, which leads to carrier suppression. Because of this phase inversion between adjacent bit periods that reduces inter-bit interference, CSRZ signals show increased tolerance to dispersion and to nonlinear penalties such are intrachannel four-wave mixing (FWM).

Furthermore, CSRZ signals subject the sensitivity of the receiver to little degradation at high power. CSRZ signals are also less sensitive to self-phase modulation (SPM), in addition to the other non-linearities already mentioned. It is also known that the duobinary format and CSRZ both have two optical electric field phase states +/−E that represent logical ONEs or MARKs, that both have the same optical power level P. When these signals are detected by the usual PIN photodiodes, which respond to the optical power, no discernible difference between the two states results, so that detection is quite simple at the receiver.

High capacity fiber-optic transmission systems such as dense wavelength-division-multiplexed (WDM) and/or time-division multiplexed (TDM) systems with many closely spaced wavelength and/or time channels modulating at high bit or data rates are required to meet the growing demand of Internet traffic bandwidth and other telecommunication systems. High data rate transmission using bit rates greater than 40 Gb/s is currently at the cutting edge of technology in fiber optic communication systems. To generate signals for a 40 Gb/s WDM system, high-speed and costly electronics have to be used. Due to the limitations of current modulators, bit rates of 80 or 160 Gb/s are usually obtained through optical time-division multiplexing (OTDM) of multiple independently modulated 40 Gb/s signals, all at the same carrier frequency but interleaved in time. In order to accomplish OTDM, the pulses of the 40 Gb/s signals must be compressed, in separate conventional pulse compressors, to an ultra-short duty cycle to avoid overlapping during multiplexing. Unfortunately, the process of pulse compression has so far been quite expensive, involving either a serial concatenation of modulators or a combination of chirped pulses with dispersion decreasing fiber. Recently, there have been some novel ideas for soliton generation to generate variable duty cycle ultra-short pulses using a single NRZ Mach-Zehnder modulator but these single modulators were not multiplexed.

Therefore there is a need to implement novel modulation techniques for converting a unipolar voltage data stream into a CSRZ optical data stream in an improved and simple optical modulator structure that can be multiplexed to mitigate nonlinear transmission impairments in fiber-optic communication systems for transmitting ultra-short pulses.

SUMMARY OF THE INVENTION

A conversion method for converting a unipolar voltage data stream into a carrier-suppressed return-to-zero (CSRZ) optical data stream includes modulating a continuous optical wave with an encoded nonreturn-to-zero (NRZ) voltage data stream for providing a CSRZ optical data stream of full-width at half-maximum (FWHM) pulse width less than one-half of the transition time of the encoded nonreturn-to-zero (NRZ) voltage data stream between logical states for a reduced pulse-width.

In one aspect of the invention, the modulating circuit is either a duobinary modulator driven with a swing of $2V_\pi$ (between modulator null points) or an optical time domain multiplexed plurality of NRZ modulators with phase shifting and differential encoding.

Additional features and advantages of the invention will be set forth in the detailed description which follows, and in part will be readily apparent to those skilled in the art from that description or recognized by practicing the invention as described herein, including the detailed description, the claims, as well as the appended drawings which follow.

It is to be understood that both the foregoing general description and the following detailed description of the present embodiments of the invention, are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention, and together with the description serve to explain the principles and operations of the invention.

DETAILED DESCRIPTION OF THE PREFERRED EMBODIMENTS

Figure 1:
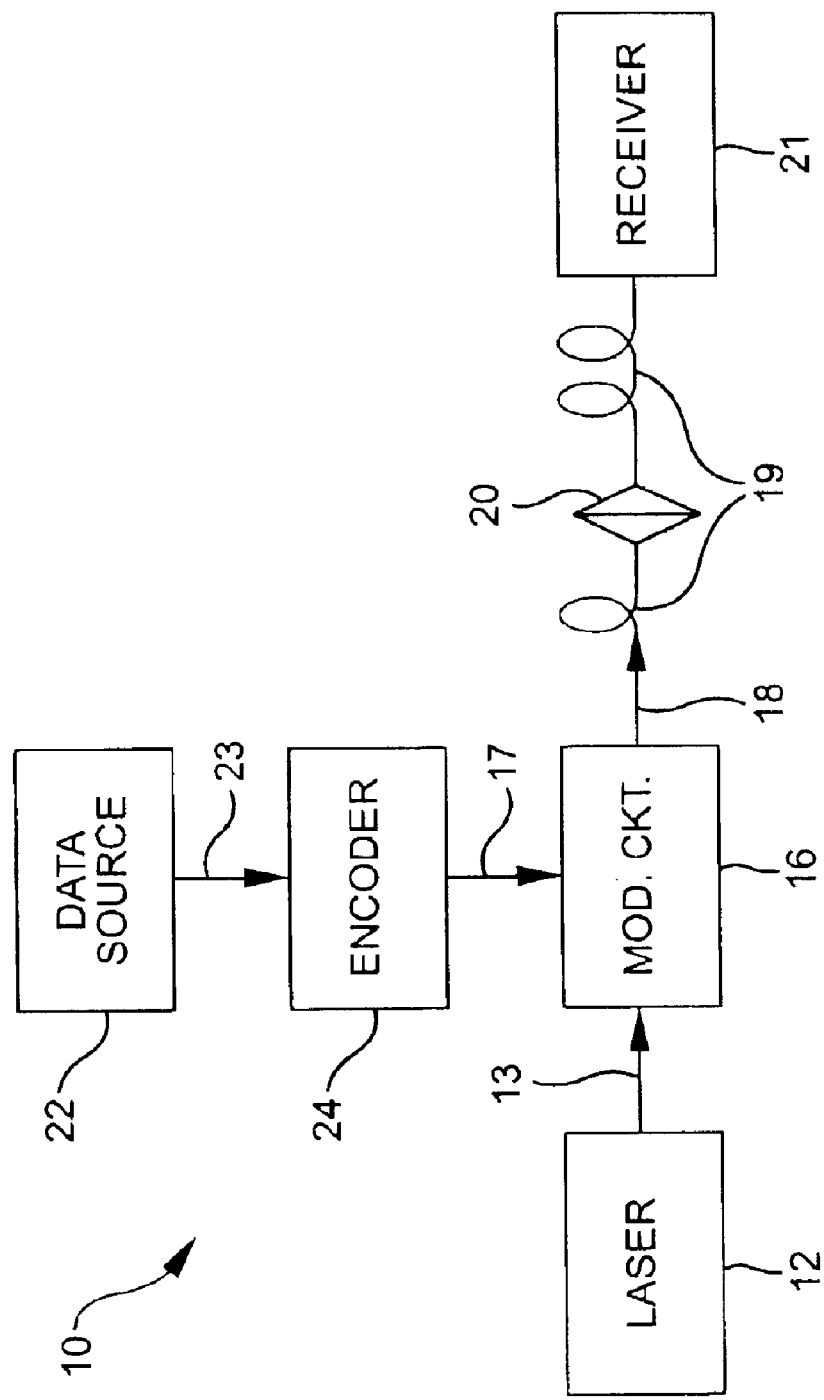
FIG. 1 is a schematic view of one embodiment of the present invention.

Reference will now be made in detail to the present preferred embodiments of the invention, examples of which are illustrated in the accompanying drawings. Whenever possible, the same reference numerals will be used throughout the drawings to refer to the same or like parts. One embodiment of the electrical unipolar to optical CSRZ converter for a more non-linear tolerant optical CSRZ transmission of the present invention is shown in FIG. 1, and is designated generally throughout by the reference numeral 10.

Referring to FIG. 1, an optical transmitter in a lightwave transmission system 10 includes a laser, as an optical source, 12 for generating or otherwise supplying a coherent continuous optical wave, DC light, or optical output beam carried by an optical fiber for reception on an optical input 13. An encoder 24, preferably in the form of a unipolar modified nonreturn-to-zero (NRZ) electrical coder for modifying the pulses of a unipolar nonreturn-to-zero (NRZ) voltage data stream as a data encoded electrical signal from a data source 22 to generate a unipolar nonreturn-to-zero (NRZ) voltage data stream as a data encoded electrical signal on an electrical input lead 17. An electrical to optical converter, preferably in the form of a modulating circuit 16, has the optical input 13 for receiving the continuous optical wave, the electrical input 17 for receiving the unipolar encoded nonreturn-to-zero (NRZ) voltage data stream as the modulated electrical signal, and an optical output 18 for providing a CSRZ optical data stream having ultra-short pulses that have a full-width at half-maximum (FWHM) pulse width less than one-half of the transition time of the encoded nonreturn-to-zero (NRZ) voltage data stream between logical states as a modulated optical signal based on the data encoded electrical signal. The optical output 18 is transmitted along lengths of an output optical fiber 19 spanning the distance to a receiver 21. Typically, an optical amplifier 20, such as an Erbium Doped Fiber amplifier (EDFA) may be provided to amplify the modulated light as it propagates along the lengths of the optical fiber 19.

Figure 2:
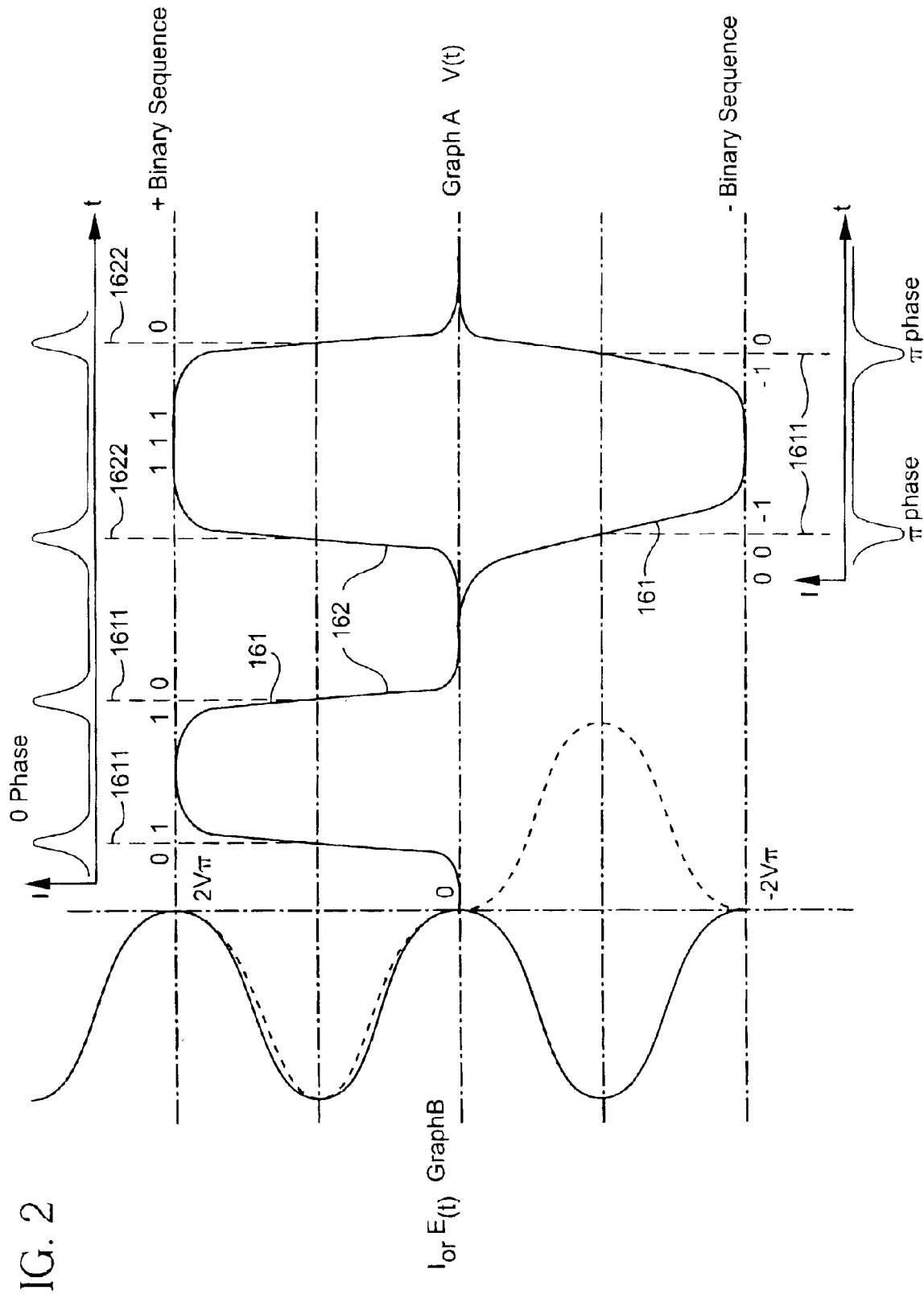
FIG. 2 is a representation of the transfer function graphs of the operation of the different modulating circuits 16 of FIG. 1, in accordance with the teachings of the present invention.

Referring to FIG. 2, the operating relationships of the modulating circuit 16, as formatted by the encoder 24 of FIG. 1 are shown for various different modulated embodiments of the modulating circuit 16 and encoder 24. In general, the modulating circuit 16 is defined by an electrical to optical converter and specifically a Mach-Zehnder interferometer modulator or any other suitable optical amplitude modulator structure implementation that will provide a CSRZ optical signal, given a unipolar NRZ data encoded electrical voltage stream.

For a single duobinary example, the encoder 24 of FIG. 1 is a duobinary encoder for encoding the unipolar NRZ voltage data stream from the data source 22 into an encoded duobinary data stream. An electrical driver, is part of the modulating circuit 16, coupled to the encoder 24 for driving a single intensity modulator with the encoded duobinary voltage data stream from the encoder 24 for the modulator to generate a carrier-suppressed return-to-zero optical data stream with a half of the plurality of CSRZ pulses having the first phase with the other half of the plurality of CSRZ pulses having the second phase for carrier suppression.

Looking at curve 161 of FIG. 2, the carrier-suppressed RZ (CSRZ) optical data stream of the modulator output has a maximum optical output (E) at the first phase (0 degree) when the encoded duobinary voltage data stream transitions from the first (0) to the second voltage (+V or $+2V_\pi$) driving level or, vice a versa, from the second to the first voltage driving level and has a maximum optical output (E) at the second phase (180 degree or $\pi$ for a resultant −E) when the encoded duobinary voltage data stream transitions from the first to a third voltage (−V or $-2V_\pi$) driving level or from the third to the first voltage driving level.

An amplitude modulator uses the input 13 for receiving the continuous wave optical stream and has a transfer function of Graph B such that the modulator provides a minimum optical output (0 or null point of intensity Graph B) at the first voltage driving level (0), a minimum optical output (0) at a second voltage driving level (+V or $+2V_\pi$) greater than the first voltage driving level, and a maximum optical output (+E) of a first phase (0) at a voltage level between the first and second voltage levels. At an opposite phase (n or 180 degree), the modulator has a minimum optical output (0) at a third (−V or $-2V_\pi$) voltage driving level less than the first voltage driving level, and a maximum optical output (E) of a second phase (180 degree for a resultant −E) at a voltage level between the first and third voltage levels.

Hence, this single modulator is preferably a known Mach Zehnder (MZ) modulator but driven in a non-standard NRZ or non-standard duobinary manner. The single modulator is biased at a modulator null point for receiving the continuous optical signal source, such as from the laser 12, and being driven, preferably in a push-pull configuration, by the duobinary data encoded voltage stream whose maximum voltage varies between $+/-2V_\pi$ relative to the bias point. By $V_\pi$ is meant the differential voltage applied by the electrical driver between the two arms of a MZ modulator that results in a πradian phase shift in the light exiting the two arms; this results, in the ideal case, in complete extinction of the light exiting the modulator as would be represented by rectangular or square pulses. This single modulator generates a train of CSRZ pulses at the transmission bit rate B to provide a suppressed optical carrier signal. It is known that the difference between amplitude and intensity (or power) modulation can be a bit subtle. Intensity modulation, commonly also referred to as On-Off Keying (OOK) simply turns the light source On and Off—as in turning a flash light "on" and "off"; no use is made of the phase of the light. Amplitude modulation, on the other hand, refers to changing the amplitude of the electric field in some specific manner, and in fact during the process, the light can be turned "ON" and "OFF" giving rise to OOK. However, in the case of nonstandard duobinary to CSRZ modulation the electric field is amplitude modulated in a very specific way such that the phase of the electric field changes in a specific way at the same time. To achieve the very specific phase properties needed for CSRZ and duobinary when a MZ modulator is used, the MZ is biased at a null point such that when the electrical signal from the electrical driver is applied, the phase of the light undergoes a nt phase change as the signal voltage swings either side of the bias point by $2V_\pi$. A phase modulator on the other hand changes ONLY the phase of the light without changing its amplitude at the same time; the amplitude remains constant throughout.

The single Mach-Zehnder (MZ) modulator thus receives the continuous optical signal source at the first input 13 of FIG. 1 and is driven by the unipolar duobinary data encoded signal at the second input 17 as received and applied by the electrical driver. Because this single MZ modulator is biased at a null point which is the same as biasing at extinction, then by applying the duobinary data encoded voltage stream, at the second input of the second MZ modulator 17, by way of the electrical driver, with a voltage whose maximum signal swing varies between $+/-2V_\pi$ relative to the bias point for driving the single modulator in a push-pull configuration, a chirp free output signal is generated which is a CSRZ optical signal for transmission in an amplitude modulated form. An advantageous feature of the CSRZ optical signal is that it is usually detected by a square-law PIN photodetector, which will decode both of the electrical field levels of +E or −E as a digital ONE or MARK pulse because the optical power or optical intensity of the pulses with electric field levels +/−E is the same resulting in identical output photocurrent pulses from the PIN photodetector.

The alternate phases will provide improved transmission performance. Work with such a carrier-suppressed modulation format suggests that alternating the phase of bits helps to reduce nonlinear impairments in optical fiber transmission systems. Also, having no unmodulated light at various "tones" reduces inter-channel four wave mixing (FWM) in dense wavelength division multiplexed (DWDM) systems, as well as reduces intra-channel FWM in very high bit rate systems. A carrier-suppressed return-to-zero (RZ) signal has both of these characteristics and can be generated with a single modulator using the teachings of this invention.

Referring to FIG. 2, various transfer functions are represented for the CSRZ converter showing voltage waveforms and resultant optical electric field and optical power waveforms when the voltage waveform has a finite rise and fall time. Thus, in FIG. 2, the relation or transfer characteristics between the driving voltage, and the realistic straight, curved, or preferably raised cosine optical pulses generated by a single modulator are represented as the transfer function of the single modulator. Curve 161 of graph A shows a drive voltage in a bipolar format, such as a duobinary bipolar format, for example, on a graph of voltage (V) versus time (t). Graph B shows the transfer characteristic function of the single modulator on a graph of optical power (Po represented by dashed lines) versus voltage (V) and optical electric field (E represented by a bold line) vs. voltage. Pulses 1611 show the corresponding optical pulse output of the single modulator in a CSRZ format that would appear on a graph of optical power (Po) versus time (t), and optical electric field vs. time. FIG. 2 thus shows how a single-stage Mach-Zehnder based duobinary modulator is driven with the transition of 0 to +V, +V to 0, 0 to −V, −V to 0 voltage levels, giving rise to the corresponding electric field levels +E, +E, −E, −E and two phase levels of π (for −E) and zero (for +E).

The letters in Graph A are simply intended to label each bit for ease of identification and correspondence between the example data voltage stream and the optical transmission stream.

Basically, either a transition of the low voltage (−V) or of the high voltage (+V) in the drive voltage of Graph A sweeps the optical power output shown in Graph B through the same maximum optical power levels, generating an optical pulse 1611. The transitions of the high voltage level (+V) or low voltage level (−V) correspond to MARK pulses or ONEs ("1") in the voltage representation of the data stream while a midlevel voltage level, normally at 0 voltage, corresponds to a "0" in the data stream. The single modulator, such as an MZ interferometer, has a maximum MARK optical output pulse (1) with a positive phase at a transition of the first voltage driving level +V, a maximum MARK optical output pulse (1) at a transition of a second voltage driving level −V of a negative phase, a minimum optical output (0) at a voltage level (0) between the first and second voltage driving level transitions and the individual phases of every pair of maximum MARK or "ONE" optical output pulses are inverted alternately within the pair corresponding to the transfer function characteristics of FIG. 2.

As is already known, duobinary coding consists of groups of +1 and −1 bits separated by one or more 0 bits. No adjacent +1 and −1 bits are allowed because there must be at least one "zero" bit between the two "one" logical states. With the teaching of this invention, a multi-level duobinary coding for an exemplary data stream of 0 +1 +1 0 −1 −1 0 +1 +1 0 starting at the transition between the initial 0 and +1 bits would yield optical fields of +E 0 +E −E 0 −E +E 0 +E. It is to be appreciated that there is a π phase difference between the +E and −E fields to provide an RZ optical data stream having different phases within the same stream. In a long data stream, half of the pulses have the +E phase, and half have the −E phase, leading to carrier suppression in the frequency domain of the original RZ stream. The entire data stream thus is divided into a half of the plurality of CSRZ pulses having a first phase with the other half of the plurality of CSRZ pulses having the second phase.

Figure 3:
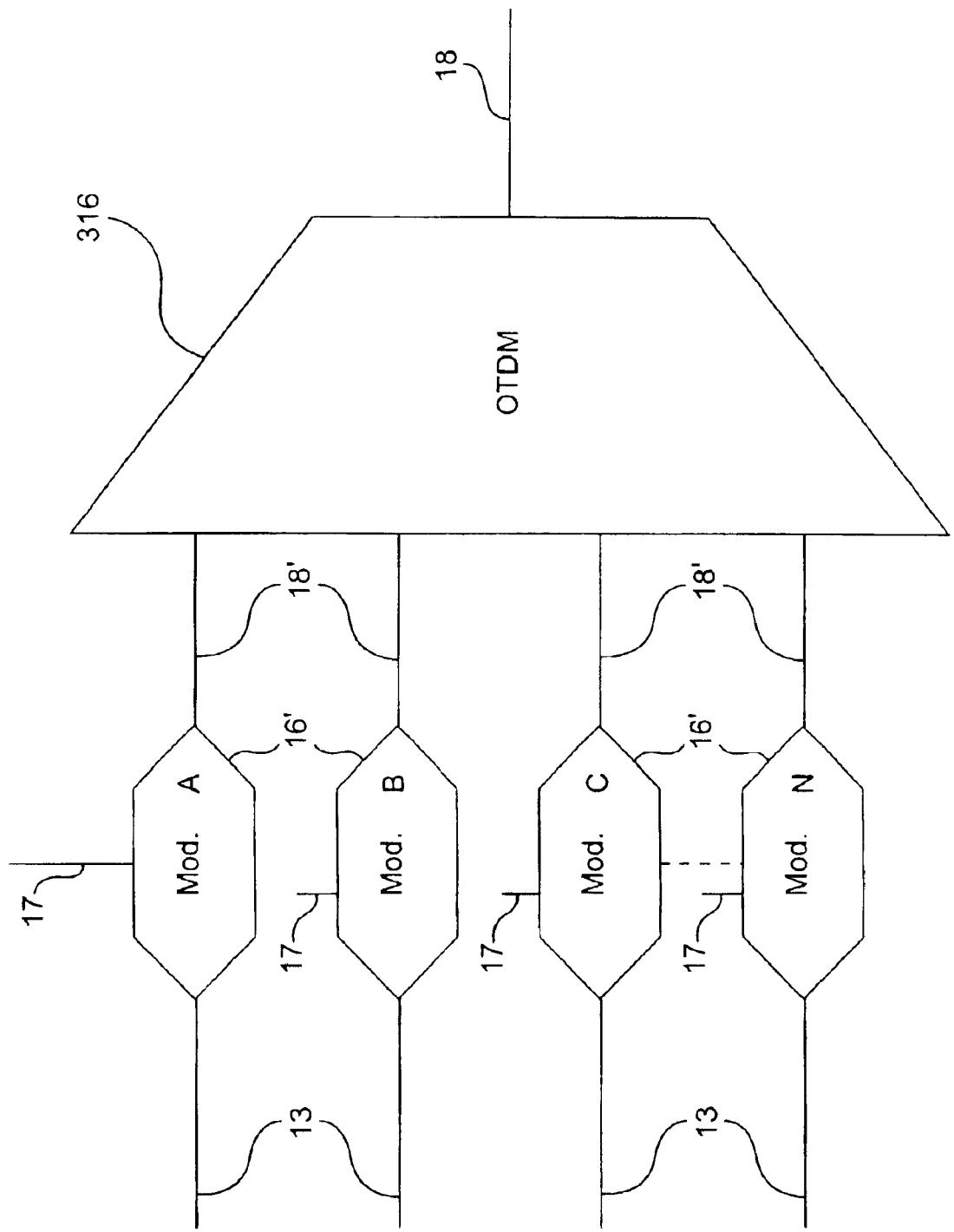
FIG. 3 is a representation of the modulating circuit 16 of FIG. 1 as embodied for an OTDM implementation, in accordance with the teachings of the present invention.

Referring to FIG. 3, the modulating circuit 16 of FIG. 1 is shown for an OTDM implementation to improve system capacity. A plurality of modulators 16' independently modulates a plurality of continuous optical waves on the optical inputs 13. At each of the electrical input leads 17, the modulator 16' each receives one of a plurality of encoded nonreturn-to-zero (NRZ) voltage data streams for providing a plurality of RZ optical data streams having different phases on modulator output or a combiner input 18'. An optical-time-domain-multiplexer (OTDM) 316, such as an interleaver, or any other type of combiner, multiplexes the plurality of RZ optical data streams having different phases received on the combiner inputs 18' into a time-division multiplexed optical data stream having a plurality of optical carrier-suppressed-return-to-zero (CSRZ) output pulses which is carrier-suppressed in the frequency domain on the optical output 18.

The generation of an RZ signal signal from an NRZ unipolar signal can be carried out with known differential digital logic circuits, converters, coders, encoders or translating circuits, respectively. The differential encoded output 17 from the logic circuit drives the single modulator 16' of FIG. 3 at the input 17 for outputting an RZ optical signal to be multiplexed.

For the plurality of N duobinary modulators, it is to be appreciated that N can be any number, and not necessarily an even number. Hence, taking the first five bits (0 +1 +1 0 −1) from the previous duobinary single modulator data stream, the output of a first duobinary modulator A would be: +E 0 +E −E. If the bit sequence of 0 −1 0 0 +1 was provided to a second duobinary modulator B, the modulator output would be: −E −E 0 +E. After being driven with these separate duobinary voltage streams, the optical pulses in the two modulator output streams from each individual modulator have every pair of pulses in one stream having an alternating phase relationship with the neighboring pair of pulses in the same stream. For example, the pulses +E+E (separated by zero or more 0 bits) have the opposite phase of the neighboring pulses −E −E (also separated by zero or more 0 bits). Thus, the optical data stream from each modulator in the plurality of modulators is carrier-suppressed. After time-interleaving the N modulator output streams, the resulting time-division multiplexed return-to-zero (RZ) optical data stream maintains this phase cancellation behavior and is also carrier-suppressed. Individually, the modulator output streams are carrier-suppressed, and they remain carrier-suppressed even after being interleaved. Hence, half of the pulses have the −E phase, and half have the −E phase, leading to carrier suppression.

To achieve a CSRZ time-division multiplexed optical data stream with non-duobinary encoding, an even number of differential encoders have to be used along with a selective phase-alternating network for selecting one or more modulators of the plurality of modulators for switching the phases of adjacent RZ optical data streams having the same phase to provide a plurality of phase alternating RZ optical data streams.

Referring back to FIG. 2, a comparison of differential and duobinary transfer characteristics are shown. Similar to the duobinary modulator, except that the differential modulator is single phased normally when driven positively, the differential intensity modulator has a minimum optical output (0 or null point of intensity Graph B) at a first voltage driving level (0), a minimum optical output (0) at a second voltage driving level (+V or $+2V_\pi$) greater than the first voltage driving level, and a maximum optical output (+E) of a single or first phase (0) at a voltage level between the first and second positive voltage levels.

The differential electrical driver drives the differential modulator with the encoded NRZ voltage data stream for the differential modulator to generate a return-to-zero (RZ) optical data stream with each pair of pulses having the same phase with the neighboring pairs of pulses, wherein the RZ optical data stream has a maximum optical output (E) at the first phase (0 degree) when the encoded NRZ voltage data stream transitions from the first (0) to the second voltage driving level (+V or $+2V_\pi$) or, from the second to the first voltage driving level.

For example, for an NRZ drive with differential encoding, a voltage stream of 0+1 +1 0 +1 +1 0 +1 +1 0 would yield optical fields of +E 0 +E +E 0 +E +E 0 +E. As can be seen, all the optical pulses have the same phase.

If the selective phase-alternating network is a drive polarity selector coupled to an alternating one of the plurality of electrical drivers, then the polarity of adjacent driving signals to adjacent differential modulators would alternately change. The negatively driven signal would cause the differential modulator to have a transfer characteristics exactly like the negative phase operation of the duobinary modulator such that only an optical pulse (−E) would appear at the transition from 0 to −1 or −V at the negative driven voltage of $-2V_\pi$.

Hence, the RZ optical output has two electric field levels, +E or −E (depending on drive polarity) and 0, and two power levels, 0 and P, when the unipolar NRZ data modulated electrical signal is applied to the electrical to optical converter to amplitude modulate the electric field. The alternate electric fields of +E and −E, selected by the drive polarity, are a form of phase-shift keying.

For example, for an NRZ drive with differential encoding, a voltage stream of 0 +1 +1 0 +1 +1 0 +1 +1 0 would be negatively driven as 0 −1 0 −1 −1 0 −1 −1 0 to yield optical fields of −E 0 −E −E 0 −E −E 0 −E. As can be seen; all the optical pulses have the same phase. After interleaving the first positive with the second negative modulator output streams, the multiplexed result would be /+E−E /00 /+E−E /+E−E /00 /+E−E /+E−E /00 /+E−E/ where all the phases cancel for carrier suppression. Of course, the separate modulators used to generate the positive and negative waveforms would be driven with separate data streams in order to increase the amount of information carried in the final output signal.

The same negative pulse (−E) would appear if the selective phase-alternating network was a 180 degree (π) phase shifter to alter the phase of the modulator output stream from a positively driven differential modulator. Instead of just 180 degrees as the phase shift, other phase shifts such as 90 degrees or other increments can be used, as long as the number of modulators are phase shifted in a way that the total phase shift is 0 degrees or 360 degrees (2π).

Figure 4:
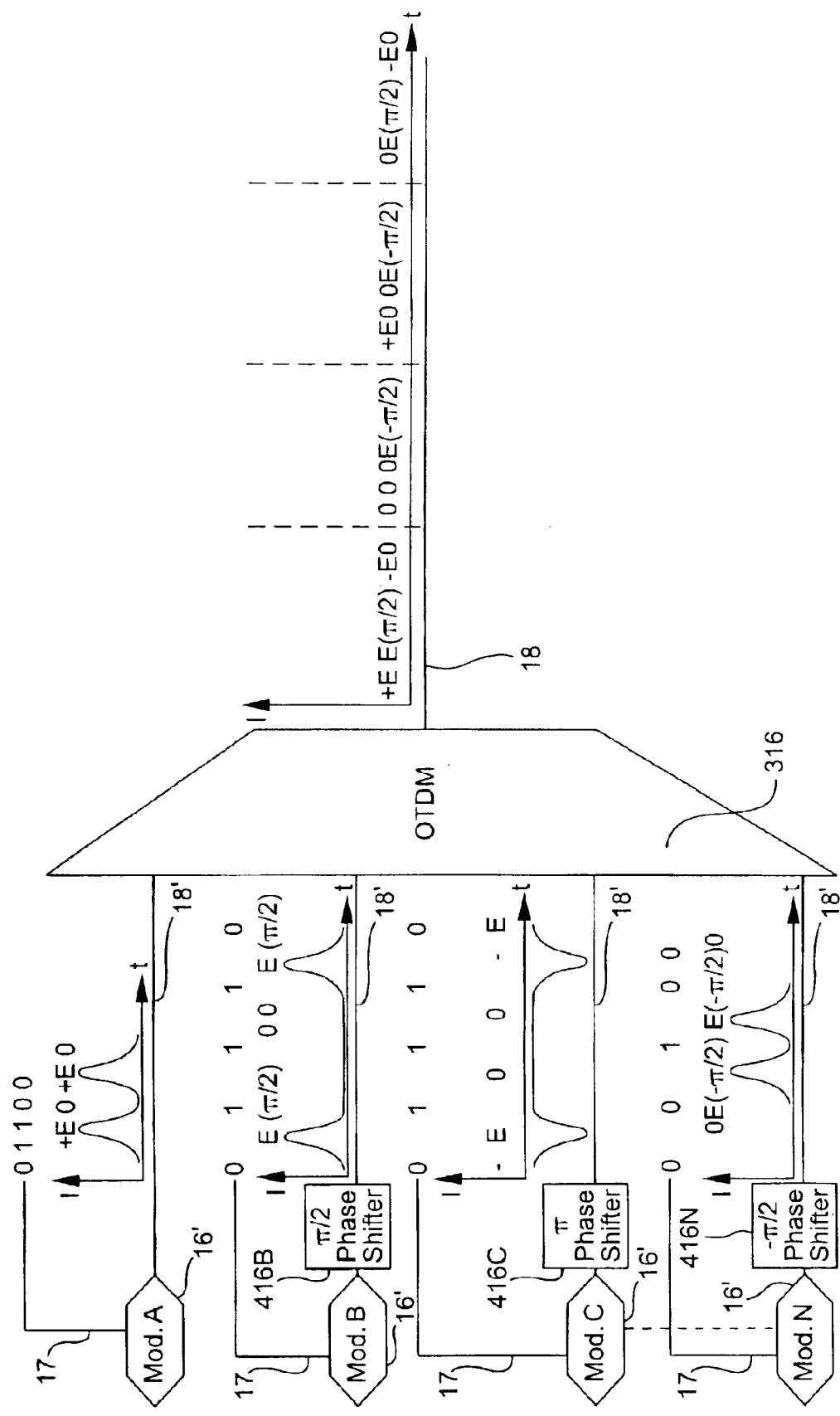
FIG. 4 is a representation of the OTDM transmitter system of FIG. 3 with one possible implementation of phase shifters used as a selective phase-alternating network 416, in accordance with the teachings of the present invention.

Referring to FIG. 4, phase shifters having 90 degrees or π/2 increments are used as a selective phase-alternating network 416 for the time-interleaved system of FIG. 3. For illustration, the first four positive bits with an ending zero (0 +1 +1 0 0) from the two duobinary modulators will be used as the NRZ encoded data stream to a first differential modulator A. The output of the first differential modulator A without any phase-shifting would then be:
+E 0 +E 0.

If the encoded stream on electrical lead of bit sequence of 0 +1 +1 +1 0 are used as the NRZ encoded data stream to a second differential modulator B, the output 18' of the second differential modulator B after application of a π/2 phase-shifter 416B would then be:
E(π/2) 0 0 E(π/2).

Assuming the encoded stream on electrical lead of bit sequence of 0 +1 +1 +1 0 are used as the NRZ encoded data stream to a third differential modulator C, the output 18' of the third differential modulator C after application of a π phase-shifter 416C would then be:
−E 0 0 −E.

The encoded stream on electrical lead of bit sequence of 0 0 +1 0 0 is used as the NRZ encoded data stream for a fourth differential modulator N; the output 18' of the fourth differential modulator N after application of a −π/2 phase-shifter 416N would then be:
0 E(−π/2) E(−π/2) 0.

After time-interleaving, the optical output 18 would show combined sequence of /+E E(π/2) −E 0/ 0 0 0 E(−π/2)/ +E 0 0 E(−π/2)/ 0 E(π/2) −E 0/ where a frame or a data slot is separated by a slash (/). Short bit sequences were specified for simplicity. However, for real transmitters in systems, long bit sequences will occur, and on average, the phases of the optical pulses would cancel out for carrier suppression.

An optional addition may be incorporated into such an OTDM system of FIG. 3 for cross-polarization of the neighboring bit streams, in order to further reduce intra-channel nonlinear penalties. A plurality of half-wave plates having an optical axis at 45 degrees provides a rotation of 90 degrees. Each of the half-wave plates are coupled to the output of every one of two adjacent differential or duobinary modulators from the plurality of such modulators for orthogonally rotating the modulated output which is already in a linear polarization to a 90 degree linear polarization of the polarization states of the optical RZ pulses such that each output of every one of two adjacent modulators are produced in alternate polarization states before being time-interleaved to produce polarization interleaved optical CSRZ output pulses.

It is appreciated that in FIG. 3 while the output pulses are modulated at a bit rate B=1/T, each of the output pulses has a narrow enough duty cycle to accommodate time-division interleaving to double or even quadruple the effective line rate to 2B or 4B, as the baud rate, respectively. If N is 4, then four independently driven NRZ modulators 16' producing ultra-short optical pulses at the same carrier frequency with a bit rate of B are time-division multiplexed to yield a single channel with a bit rate of 4B on the optical output 18. For example, four streams, each at a bit rate of 40 Gb/s may use OTDM to generate one 160 Gb/s channel on the optical output 18. The criterion for successfully accomplishing OTDM with four input streams is that the duty cycle of the input streams be less than 25% in order to prevent pulse interference. As shown in FIG. 3, this is easily accomplished using a single NRZ modulator, as each of the four modulators 16', with a rise/fall time or transition between logical states in each modulator set for less than 75% of the bit period, as provided by the table of FIG. 5, if a raised cosine is chosen as the preferred shape of the data pulse from the data source 22 of FIG. 1. Dividing 100% of the full duty cycle, which would have been available as the full data slot or one singe frame for one original unmultiplexed pulse into four subslots yield 25%.

Figure 6:
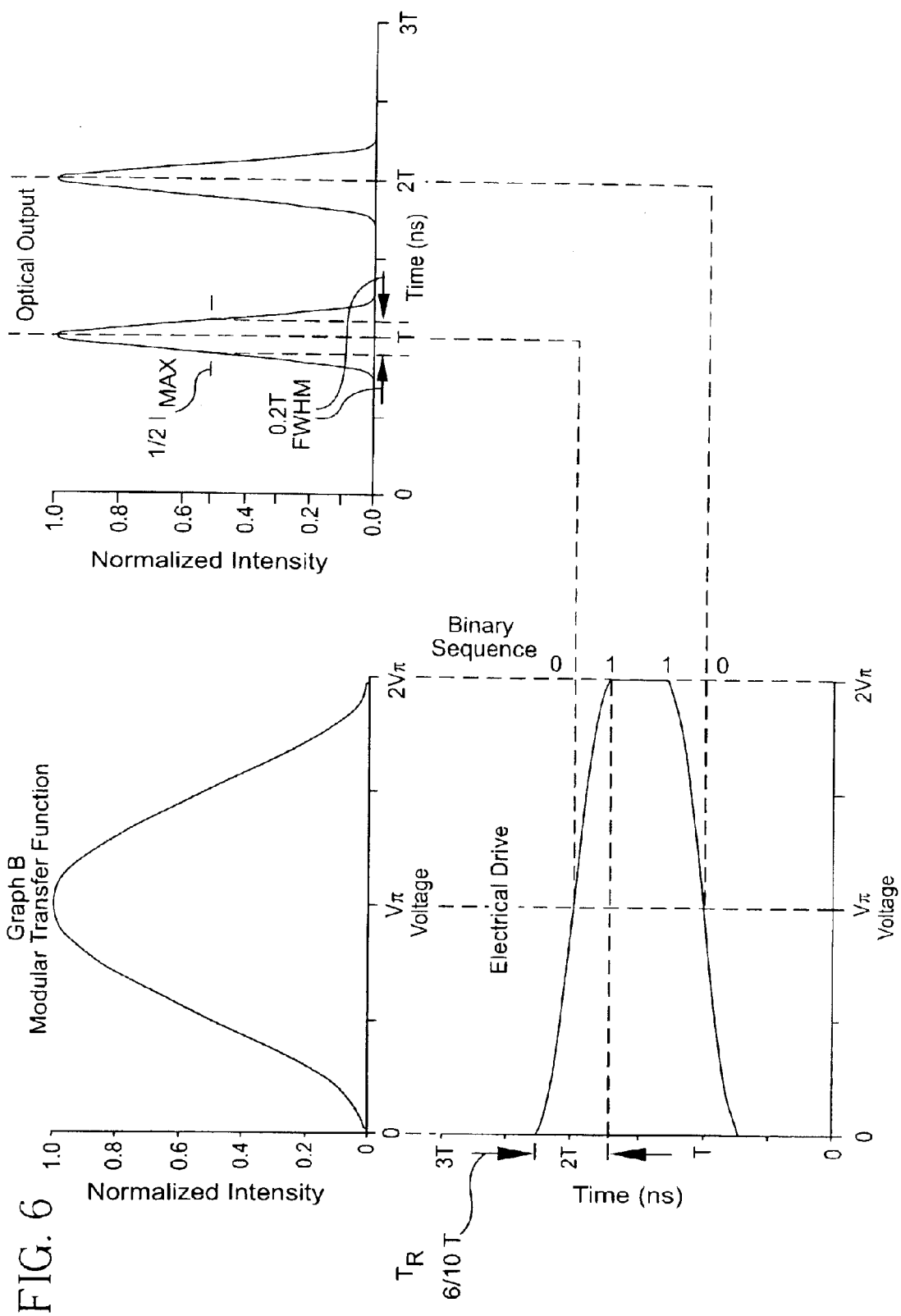
FIG. 6 is a representation of an extract of the transfer function graph of FIG. 2 to show the FWHM relationship of FIG. 5 for a particular rise time of 0.6T, in accordance with the teachings of the present invention.

As seen in FIG. 2, the driving voltage V(t) of FIG. 2 results in generation of optical pulses with a corresponding period T, such as in FIG. 6. The duty cycle ($d_c$) of the optical pulses generated by the modulator 16' is defined as the full width at one-half the maximum power intensity of the pulses, FWHM, divided by the period of the optical pulse signal T, as shown by the following equation:

$$d_c = FWHM/T \quad \text{(Eq. 1)}$$

Hence, it is seen that the rise time/fall time or the transient time of a change in voltage V affects the FWHM of the output pulse. The time-varying voltage V(t) driving function of FIG. 2 is applied to the electrical input lead 17 and defines its conversion of the CW optical signal or any other input optical signal 13 into an output optical signal 18' of FIG. 3 from the constructive interference between the arms at the transitions at either direction from a "zero".

Figure 5:
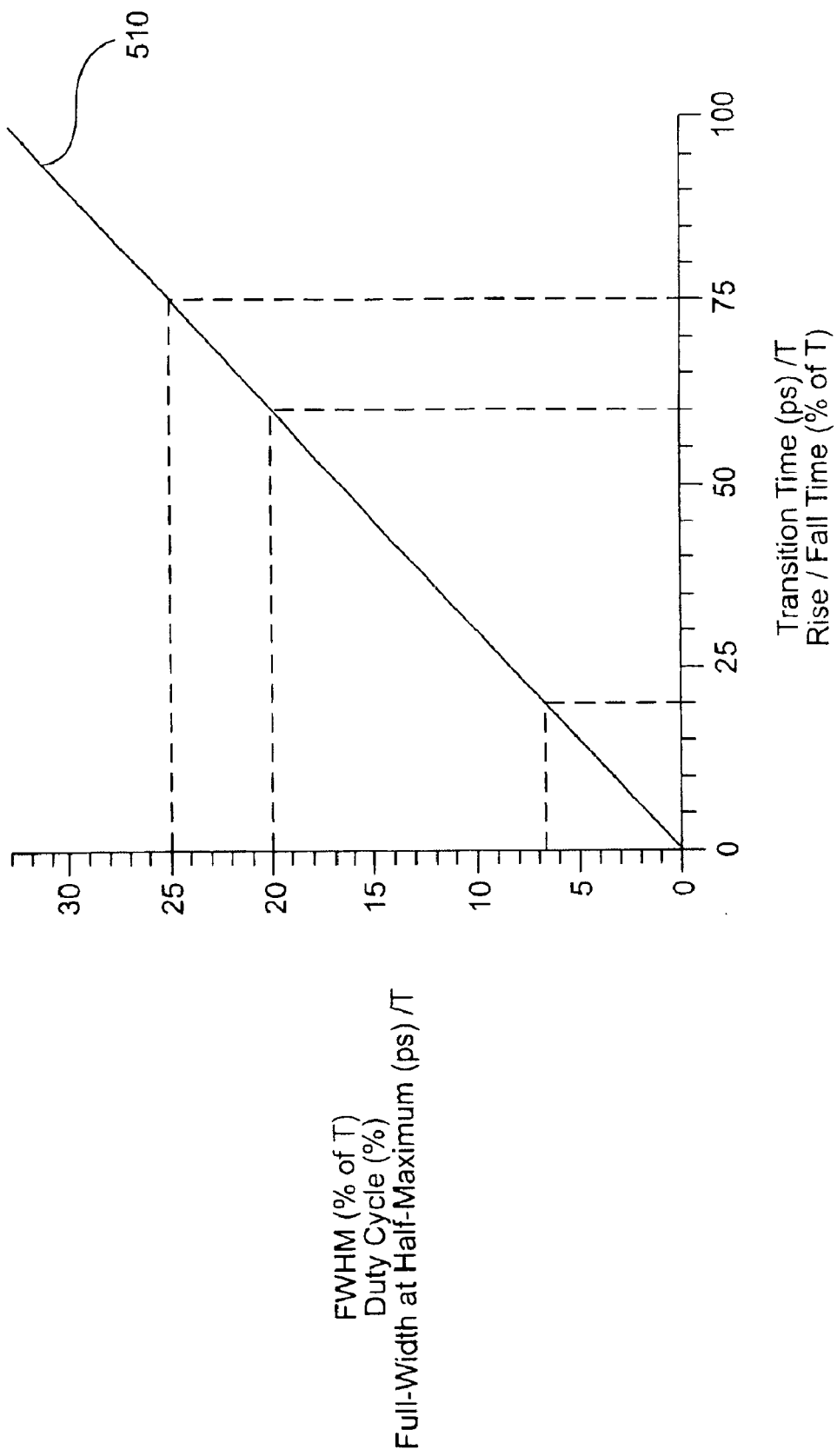
FIG. 5 is a graph of the optical output duty cycle as a function of the transition time for a raised cosine drive, in accordance with the teachings of the present invention.

Referring to FIG. 5, the linear relationship line 510 intersects 25 on the y-axis for the duty cycle as a percentage of the bit period or FWHM with 75 on the x-axis for the transition time ($T_r$) or rise or fall time ($T_r$) as a percentage of the bit period. Dividing 25/75 yields 1/3 as the linear constant slope of line 510, which is the preferred ratio of FWHM/$T_r$. Hence, the FWHM of the CSRZ optical data stream is preferably at about one-third of the transition time of the encoded nonreturn-to-zero (NRZ) voltage data stream between logical states. However, the full-width at half-maximum (FWHM) pulse width could possibly be set at other values less than one-half of the transition time.

If time-interleaving is done with the plurality of RZ optical data streams in unevenly time-interleaved time-slots for producing unequally spaced optical CSRZ output pulses which would further reduce nonlinearities, the original full-width at half-maximum (FWHM) pulse width at less than one-half or even less than one-third of the transition time would be further time-delayed a sufficient amount to accommodate the uneven time-delays.

In the general embodiment of FIG. 1, the optical pulse shapes of the CSRZ output signal for transmission in an amplitude modulated form are determined partly by the encoder 24 that generates the data encoded voltage input pulse train from the pulse shape and duty cycle supplied by the data source 22. Specifically, the optical pulse shape is determined both by the shape of the signal output from the logic circuit of the encoder 24 along with the transfer function of the MZ modulator, as seen in FIG. 2, and any drive electronics of the electrical driver in between.

Referring to FIGS. 2, 4–6, the transfer function inputs and outputs of each modulator 16' of FIG. 3 are represented for a realistic application of a raised cosine as the preferred shape of the data pulse from the data source 22 of FIG. 1 for controlling the corresponding shape of the driving function from the encoder 24 of FIG. 1. Instead of being assumed internal to the data source 22 of FIG. 1, optional external blocks can be inserted to represent the function of an optional duty cycle tuner and pulse shaper for the electrical to optical CSRZ converter. The voltage waveforms and resultant optical electric field and optical power waveforms when the voltage waveform has a finite rise and fall time, as with a raised cosine shape, are shown with a rise time $T_r$ of 0.6 T or a transition time of 0.15 ns when the bit period or T is 0.25 ns which is 1/B when B=40 Gbits/s in FIG. 6. Looking at the optical output, the FWHM is 0.2T which correlates to the 20% T in FIG. 5 for rise time value of 60% T. If the voltage waveform is perfectly square (zero rise and fall time), a step function would result instead. Thus, in FIG. 6, the relation or transfer characteristics between the driving voltage, and the realistic raised cosine optical pulses that are smooth or curved, instead of squared, are represented as the transfer function of the modulating 16 of FIG. 1.

FIG. 6 therefore represents the transfer characteristics between the driving voltage, and the realistic rounded optical pulses generated by a practical modulating circuit 16 and a practical encoder 24 and data source 22 of FIG. 1. Practical implementation of the differential or duobinary encoder 24 of FIG. 1 in electrical form, will in fact result in pseudo CSRZ in optical form for the multiplexed optical stream of FIG. 3. Because of band-limiting on the electrical signal by electrical circuits having a limited bandwidth and the MZ modulator itself having limited bandwidth, the electrical signal edges will have finite rise and fall times, as in a sinusoidal pulse, or the preferred raised cosine electrical signal that results in very Gaussian-like optical pulses, instead of a perfect square-wave pulse, creating a pseudo-CSRZ electrical signal when the phases cancel out. Thus the differential or duobinary encoder 24 and NRZ data source 22, each having a limited bandwidth for converting NRZ to RZ or duobinary, respectively, result in a data modulated electrical signal in electrical form also with finite rise and fall times at the electrical input of the modulators 16' causing a pseudo CSRZ modulated optical signal in optical form at the optical output 18 of the modulating circuit 16 of FIG. 1. The term "pseudo-CSRZ" used in this patent application refers to a MARK pulse returning to zero and all flipping of polarity canceling out. For example, two "ONEs" whether positive or negative, or with other differences in phase, in sequence that would eventually cancel will look like a pseudo carrier suppressed return-to-zero pulse because "zero" is reached in between the two "ONEs" because of the rounding of edges of the first and second output power pulse from the bandlimiting of the data signal. Bandlimited NRZ unipolar input signals thus generate CSRZ optical signals providing the advantageous spectral characteristics of both the modified duobinary signals or CSRZ signals that result in improved (simulated) transmission characteristics when compared with ordinary NRZ.

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

What is claimed is:

1. A method for converting a unipolar voltage data stream into a carrier-suppressed return-to-zero (CSRZ) optical data stream, the method comprising the steps of:
supplying a coherent continuos optical wave;
supplying a nonreturn-to-zero (NRZ) voltage unipolar data stream;
formatting the nonreturn-to-zero (NRZ) voltage unipolar data steam into an encoded non-return-to-zero (NRZ) voltage data stream; and
modulating the continuous optical wave with the encoded nonreturn-to-zero (NRZ) voltage data stream for providing a CSRZ optical data stream of full-width at half-maximum (FWHM) pulse width less than one-half of the transition time of the encoded nonreturn-to-zero (NRZ) voltage data se between logical states for a reduced pulse-width.

2. A method for converting a unipolar voltage data stream into a carrier-suppressed return-to-zero (CSRZ) optical data stream, the method comprising the steps of:
supplying a coherent continuous optical wave;
supplying a nonreturn-to-zero (NRZ) voltage unipolar data stream;
formatting a nonreturn-to-zero (NRZ) voltage unipolar data stream into an encoded nonreturn-to-zero (NRZ) voltage data stream; and
modulating the continuous optical wave with the encoded nonreturn-to-zero (NRZ) voltage data stream for providing a CSRZ optical data stream of full-width at half-maximum (FWHM) pulse width less than one-half of the transition time of the encoded nonreturn-to-zero (NRZ) voltage data stream between logical states for a reduced pulse-width, wherein the modulating step comprises providing the CSRZ optical data stream of full-width at half-maximum (FWHM) pulse width at about one-third of the transition time of the encoded nonreturn-to-zero (NRZ) voltage data stream between logical states.

3. The method of claim 2, wherein the formatting step comprises the step of duobinary encoding of the NRZ voltage data stream.

4. The method of claim 2, wherein the modulating step comprises the steps of:
multiple-modulating a plurality of continuous optical waves each with a plurality of encoded nonreturn-to-zero (NRZ) voltage data streams for providing a plurality of RZ optical data streams having different phases; and
optical-time-domain-multiplexing the plurality of RZ optical data streams having different phases into a time-division multiplexed (TDM) optical data stream having a plurality of optical carrier-suppressed-return-to-zero (CSRZ) output pulses which is carrier-suppressed in the frequency domain.

5. The method of claim 4, wherein the optical-time-domain-multiplexing comprises time-interleaving the plurality of RZ optical data streams having different phases in unevenly time interleaved time-slots for producing unequally spaced optical CSRZ output pulses.

6. The method of claim 4, wherein the formatting step comprises the step of duobinary coding of the NRZ voltage data stream.

7. The method of claim 4, wherein the multiple-modulating step comprises the steps of:
modulating in a plurality of modulating circuits a plurality of continuous optical waves with a plurality of nonreturn-to-zero (NRZ) voltage data streams for providing a plurality of unipolar optical data streams, each data stream including a plurality of return-to-zero (RZ) optical pulses, wherein the plurality of return-to-zero (RZ) optical pulses in a single data stream have the same phase but are phase-shifted from the plurality of return-to-zero (RZ) optical pulses in one or more of the other data streams; and
time-division multiplexing the plurality of unipolar optical data streams such that the phases of the plurality of unipolar optical data streams cancel for providing a time-division multiplexed return-to-zero (RZ) optical data stream having a plurality of optical carrier-suppressed return-to-zero (CSRZ) output pulses with each frame of pulses having an alternating phase relationship with at least one of the neighboring frames of pulses.

8. The method of claim 7, wherein the formatting step comprises the step of differential encoding of the NRZ voltage data stream.

9. The method of claim 2, wherein the supplying step comprises the step of supplying the nonreturn-to-zero (NRZ) voltage unipolar data stream having a raised cosine shape.

10. The method of claim 8, wherein the plurality of return-to-zero (RZ) optical pulses in a single data stream are phase-shifted from the plurality of return-to-zero (RZ) optical pulses in one or wore of the other data steams by 180 degrees.

11. The method of claim 8, wherein the plurality of return-to-zero (RZ) optical pulses in a single data stream are phase-shifted from the plurality of return-to-zero (RZ) optical pulses in one or more of the other data steams by 90 degrees.

12. An apparatus for converting a unipolar voltage data stream into a carrier-suppressed return-to-zero (CSRZ) optical data stream, the apparatus comprising:
an optical source for supplying a coherent continuous optical wave;
a data source for supplying a nonreturn-to-zero voltage unipolar data stream;
an encoder coupled to the data source for providing a unipolar encoded nonreturn-to-zero (NRZ) voltage data stream; and
a parallel concatenating modulating circuit coupled to the optical source and the encoder for modulating the continuous optical wave with the unipolar encoded nonreturn-to-zero (NRZ) voltage data stream for providing a CSRZ optical data stream having a plurality of CSRZ pulses, where each of the CSRZ pulses has a full-width at half-maximum (FWHM) pulse width less than one-half of the transition time of the encoded nonreturn-to-zero (NRZ) voltage data stream between logical states.

13. The apparatus of claim 12 wherein the apparatus comprises:
the encoder comprising a duobinary encoder for encoding the unipolar NRZ voltage data stream into an encoded duobinary data stream; and
the modulating circuit comprising:
an amplitude modulator having an input for receiving the continuous wave optical stream, wherein the modulator has a minimum optical output at a first voltage driving level, a minimum optical output at a second voltage driving level greater than the first voltage driving level, and a maximum optical output of a first phase at a voltage level between the first and second voltage levels, wherein the modulator has a minimum optical output at a third voltage driving level less than the first voltage driving level, and a maximum optical output of a second phase at a voltage level between the first and third voltage levels; and an electrical driver for driving the modulator with the encoded duobinary voltage data stream for the modulator to generate a carrier-suppressed return-to-zero optical data stream with a half of the plurality of CSRZ pulses having the first phase with the other half of the plurality of CSRZ pulses having the second phase for carrier suppression, wherein the carrier-suppressed RZ (CSRZ) optical data stream has a maximum optical output at the first phase when the encoded duobinary voltage data stream transitions from the first to the second voltage driving level or from the second to the first voltage driving level and has a maximum optical output at the second phase when the encoded duobinary voltage data stream transitions from the first to the third voltage driving level or from the third to the first voltage driving level.

14. The apparatus of claim 12, wherein the modulating circuit comprises:

a plurality of parallel modulators for independently modulating a plurality of continuous optical waves each with a plurality of encoded nonreturn-to-zero (NRZ) voltage data streams for providing a plurality of RZ optical data streams having different phases; and an optical-time-domain-multiplexer for multiplexing the plurality of RZ optical data streams having different phases into a time-division multiplexed optimal data stream having a plurality of optical carrier-suppressed-return-to-zero (CSRZ) output pulses which is carrier-suppressed in the frequency domain.

15. The apparatus of claim 14, wherein each of the plurality of modulators comprises:

the encoder comprising a duobinary coder for encoding the unipolar NRZ voltage data stream into an encoded duobinary data stream; and the modulating circuit comprising:

an amplitude modulator having an input for receiving the continuous wave optical stream, wherein the modulator has a minimum optical output at a first voltage driving level, a minimum optical output at a second voltage driving level greater than the first voltage driving level, and a minimum optical output of a first phase at a voltage level between the first and second voltage levels, wherein the modulator has a minimum optical output at a third voltage driving level less than the first voltage driving level, and a maximum optical output of a second phase at a voltage level between the first and third voltage levels; and an electrical driver for driving the modulator with the encoded duobinary voltage data stream for the modulator to generate a carrier-suppressed return-to-zero optical data stream with each pair of pulses of one of the plurality of modulators having an alternating phase relationship with the neighboring pairs of pulses of the same modulator, wherein the carrier-suppressed (CSRZ) optical data stream has maximum optical output at the first phase when the encoded duobinary voltage data stream transitions from the first to the second voltage driving level or from the second to the first voltage driving level and has a maximum optical output at the second phase when the encoded duobinary voltage data stream transitions from the first to the third voltage driving level or from the third to the first voltage driving level.

16. The apparatus of claim 14, wherein each of the plurality of modulators comprises:

the encoder comprising a differential encoder for encoding the unipolar NRZ voltage data stream into an encoded NRZ data stream; and the modulating circuit comprises:

an amplitude modulator having an input for receiving the continuous wave optical stream, wherein the modulator has a minimum optical output at a first voltage driving level, a minimum optical output at a second voltage driving level greater than the first voltage driving level, and a second optical output of a first phase at a voltage level between the first and second voltage levels; and an electrical driver for driving the modulator with the encoded NRZ voltage data stream for the modulator to generate a return-to-zero (RZ) optical data stream with each pair of pulse having the same phase with the neighboring pairs of pulses, wherein the RZ optical data stream has a maximum optical output at the first phase when the encoded NRZ voltage data stream transitions from the first to the second voltage driving level or from the second to the first voltage driving level; and a selective phase-alternating network for selecting one or more modulators of the plurality of modulators for switching the phase of adjacent RZ optical data streams to provide a plurality of phase alternating RZ optical data streams.

17. The apparatus of claim 16, wherein the selective phase-alternating network comprises a drive polarity selector coupled to the corresponding plurality of electrical drivers for alternately changing the polarity of adjacent driving signals to adjacent modulators.

18. The apparatus of claim 16, wherein the selective phase-alternating network comprises a phase shifter for altering the phases of adjacent RZ optical data streams.

19. The apparatus of claim 18, wherein the phase shifter comprises a 180 degree phase shifter for providing a phase difference equal to 180 degrees between adjacent RZ optical data streams to result in a phase difference between adjacent optical CSRZ output pulses in a multiplexed data slot equal to 180 degrees.

20. The apparatus of claim 18, wherein the phase shifter comprises a 90 degree phase shifter for providing a phase difference equal to 90 degrees between adjacent RZ optical data streams to result in a phase difference between adjacent optical CSRZ output pulses in a multiplexed data slot equal to 90 degrees.

* * * * *